(12) United States Patent
Nakamura et al.

(10) Patent No.: US 8,344,371 B2
(45) Date of Patent: Jan. 1, 2013

(54) ULTRAVIOLET SENSOR

(75) Inventors: Kazutaka Nakamura, Yasu (JP); Yoshihiro Ito, Yasu (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 37 days.

(21) Appl. No.: 12/123,849

(22) Filed: May 20, 2008

(65) Prior Publication Data

US 2008/0217611 A1  Sep. 11, 2008

Related U.S. Application Data

(63) Continuation of application No. PCT/JP2006/309798, filed on May 17, 2006.

(30) Foreign Application Priority Data

Nov. 24, 2005  (JP) ................................ 2005-338319

(51) Int. Cl.
   *H01L 29/10* (2006.01)
(52) U.S. Cl. ................... 257/43; 257/E31.015
(58) Field of Classification Search ......... 257/43, 257/461, E31.015
   See application file for complete search history.

(56) References Cited

U.S. PATENT DOCUMENTS

| | | | | |
|---|---|---|---|---|
| 4,910,570 | A * | 3/1990 | Popovic | 257/290 |
| 5,612,229 | A * | 3/1997 | Yoshida | 438/72 |
| 6,846,731 | B2 * | 1/2005 | Lu et al. | 438/570 |
| 6,936,865 | B2 * | 8/2005 | Tonooka | 257/103 |
| 2002/0016017 | A1 * | 2/2002 | Sakai et al. | 438/57 |
| 2002/0121960 | A1 * | 9/2002 | Ando et al. | 338/21 |
| 2003/0142463 | A1 * | 7/2003 | Nakamura et al. | 361/321.2 |
| 2003/0160176 | A1 * | 8/2003 | Vispute et al. | 250/372 |
| 2005/0045808 | A1 * | 3/2005 | Yonezawa et al. | 250/214 R |
| 2005/0145970 | A1 * | 7/2005 | Lu et al. | 257/449 |
| 2005/0253136 | A1 * | 11/2005 | Ono et al. | 257/40 |
| 2005/0282304 | A1 * | 12/2005 | Inoue et al. | 438/29 |

FOREIGN PATENT DOCUMENTS

| | | |
|---|---|---|
| EP | 0 849 808 A2 | 6/1998 |
| JP | 2003-142700 | 5/2003 |
| JP | 2003142700 A * | 5/2003 |
| JP | 2004-172166 | 6/2004 |
| JP | 2004172166 A * | 6/2004 |

(Continued)

OTHER PUBLICATIONS

PCT/JP2006/30978 International Search Report dated Jun. 30, 2006.

(Continued)

*Primary Examiner* — Kimberly Rizkallah
*Assistant Examiner* — Duy T Nguyen
(74) *Attorney, Agent, or Firm* — Dickstein Shapiro LLP

(57) ABSTRACT

A diode type ultraviolet sensor having a layered-structure body including a conductive layer composed of a sintered ceramic body having conductivity and a semiconductor layer composed of an oxide semiconductor including ZnO. The semiconductor layer is disposed on a principal surface of the conductive layer and forms a heterojunction with the conductive layer. The ultraviolet sensor is used in such a condition that the semiconductor layer is positioned at a light-receiving side irradiated by ultraviolet rays. The semiconductor layer is preferably composed of a sintered body. The sintered body serving as the conductive layer and sintered body serving as the semiconductor layer are preferably formed by co-firing. Terminal electrodes are provided on a principal surface and the other principal surface of the layered-structure body, respectively.

5 Claims, 2 Drawing Sheets

FOREIGN PATENT DOCUMENTS

WO       WO-02/01650 A1     1/2002
WO       WO-2004/047187 A1     6/2004

OTHER PUBLICATIONS

PCT/JP2006/30978 Written Opinion dated Jun. 30, 2006.
Ying, M.J. et al.; "Interface engineering for lattice-matched epitaxy of ZnO on (La, Sr)(Al, Ta)$O_3$(111) substrate"; Applied Physics Letters, American Institute of Physics, Melville, NY, vol. 87, No. 20, Nov. 9, 2005.
Kim, Il-Doo, et al.; "Low-voltage $Z_nO$ thin-film transistors with high-$K$ $Bi_{1.5}Zn_{1.0}Nb_{1.5}O_7$ gate insulator for transparent and flexible electronics"; Applied Physics Letters, American Institute of Physics, Melville, NY, vol. 87, No. 4, Jul. 22, 2005.

* cited by examiner

ULTRAVIOLET SENSOR

CROSS REFERENCE TO RELATED APPLICATIONS

The present application is a continuation of International Application No. PCT/JP2006/309798, filed May 17, 2006, which claims priority to Japanese Patent Application No. JP2005-338319, filed Nov. 24, 2005, the entire contents of each of these applications being incorporated herein by reference in their entirety.

FIELD OF THE INVENTION

The present invention relates to an ultraviolet sensor, in particular, to a diode type ultraviolet sensor having a layered structure including a heterojunction.

BACKGROUND OF THE INVENTION

Ultraviolet sensors have been used as flame sensors in fire alarms, devices for monitoring a condition of combustion in burners, or the like and further have been used as ultraviolet-ray sensing devices in simple apparatuses for measuring an amount of irradiation of ultraviolet ray outdoors. Furthermore, such ultraviolet sensors are expected to become next generation of optical communication devices using ultraviolet rays.

As ultraviolet sensors, typically, sensors using a diamond semiconductor or a SiC semiconductor have been developed and commercialized. However, ultraviolet sensors using such a diamond semiconductor or a SiC semiconductor have problems that the materials cannot be easily processed and that the cost of the materials is high.

Therefore, recently, ultraviolet sensors using an oxide semiconductor material have been studied. For example, a diode type sensor having a heterojunction structure composed of an n-type semiconductor layer including titanium oxide as a main component and a transition metal oxide thin film, the diode type sensor having sensitivity in an ultraviolet region has been proposed (refer to, for example, Patent Document 1). In the ultraviolet sensor described in Patent Document 1, the n-type semiconductor layer including titanium oxide as a main component is a single crystal substrate and the transition metal oxide thin film is formed by epitaxial growth. Note that although the single crystal substrate and the thin film are heat-treated by annealing or the like, they are not sintered bodies. Furthermore, in the ultraviolet sensor described in Patent Document 1, the transition metal oxide thin film is positioned at a light-receiving side which is irradiated by ultraviolet rays.

The ultraviolet sensor described in Patent Document 1, however, has problems as described below.

The n-type semiconductor layer including titanium oxide as a main component and placed at a base side of the ultraviolet sensor has a high specific resistance, or a low electrical conductance, so that sensitivity of the ultraviolet sensor is relatively low. This is supported by the data shown in FIG. 5 of Patent Document 1. Furthermore, since the transition metal oxide thin film is positioned at a light-receiving side, a light transmittance thereof is low. Also, this leads to the sensitivity thereof being low. Patent Document 1: Japanese Unexamined Patent Application Publication No. 2004-172166.

SUMMARY OF THE INVENTION

The present invention provides an ultraviolet sensor that can solve the above-mentioned problems.

In order to solve the above-mentioned technical problems, the ultraviolet sensor of the present invention has a layered-structure body including a conductive layer composed of a sintered ceramic body having conductivity and a semiconductor layer composed of an oxide semiconductor including ZnO. The semiconductor layer is disposed on a principal surface of the conductive layer and forms a heterojunction with the conductive layer. The semiconductor layer is positioned at a light-receiving side which is irradiated by ultraviolet rays.

Preferably, not only the conductive layer but also the semiconductor layer is made of a sintered body. In this case, the sintered body serving as the conductive layer and the sintered body serving as the semiconductor layer are preferably formed by co-firing.

Furthermore, the semiconductor layer preferably includes 0.1 to 3 mol % Co.

The conductive layer preferably includes a transition metal oxide. In this case, the transition metal oxide is preferably a perovskite-type oxide represented by $ABO_3$ (A is an element selected from rare earth elements, Sr, and Ba or a solid solution including at least one element selected from rare earth elements, Sr, and Ba. B is an element selected from Mn, Co, and Ni or a solid solution including at least one element selected from Mn, Co, and Ni).

The ultraviolet sensor of the present invention preferably further includes a translucent conductive film provided on a principal surface of the semiconductor layer at a light-receiving side thereof irradiated by ultraviolet rays.

The ultraviolet sensor of the present invention preferably includes a terminal electrode provided on a principal surface of the layered-structure body and a terminal electrode provided on the other principal surface thereof.

According to the present invention, since a conductive layer is placed at a base side, a high electrical conductance can be achieved at the base side. Furthermore, since the conductive layer is a sintered ceramic body, a high current-amplification property (diode characteristic) can be obtained by forming a heterojunction at an interface of the conductive layer and a semiconductor layer. Furthermore, since the semiconductor layer, which is made of a semiconductor oxide including ZnO, is positioned at a light-receiving side, a light transmittance is high. Furthermore, since the light transmittance of the conductive layer made of a sintered ceramic body is relatively low, efficiency with which ultraviolet rays are absorbed by the conductive layer can be increased.

In consideration of the above, the ultraviolet sensor of the present invention can achieve high sensitivity.

In the present invention, in the case that not only the conductive layer but also the semiconductor layer is made of a sintered body, the sintered body serving as the conductive layer and the sintered body serving as the semiconductor layer can be obtained by co-firing. Furthermore, since the ZnO, which is included in the semiconductor layer, does not easily diffuse into the conductive layer in a sintering step compared with $TiO_2$ and the like, the interface (barrier) of the conductive layer and the semiconductor layer can be easily formed.

If the semiconductor layer includes 0.1 to 3 mol % Co, the sensitivity of the ultraviolet sensor can be improved due to a decrease in dark current. If the content of the Co exceeds 3 mol %, the sensitivity is lowered due to a decrease in the light transmittance. On the other hand, the lower limit of the content of the Co is not defined because the effect of Co is actually observed even if the content of the Co is in the order of ppm. However, in order to specify the range of the content of Co, the lower limit thereof is defined to be 0.1 mol % as mentioned above.

In the case that the conductive layer includes a transition metal oxide and more preferably includes a perovskite-type oxide represented by $ABO_3$, when a depletion layer region formed at of the interface between the conductive layer and the semiconductor layer is irradiated with excitation rays including ultraviolet rays and then carriers are excited and photocurrent is generated, carriers are excited by only the ultraviolet rays because each of band gaps of the transition metal oxide in the conductive layer and the ZnO in the semiconductor layer is large and the excitation energy is as high as 3.2 eV. Furthermore, since an interface level is generated between the transition metal oxide and ZnO, electric current can be amplified to achieve higher sensitivity.

In the ultraviolet sensor of the present invention, if a translucent conductive film is formed on a principal surface of the semiconductor layer irradiated by the ultraviolet rays, since the translucent conductive film reduces resistance in the principal surface direction of the semiconductor layer, current loss is reduced and the photocurrent is increased, so that a current sensitivity can be improved.

Figure 1:
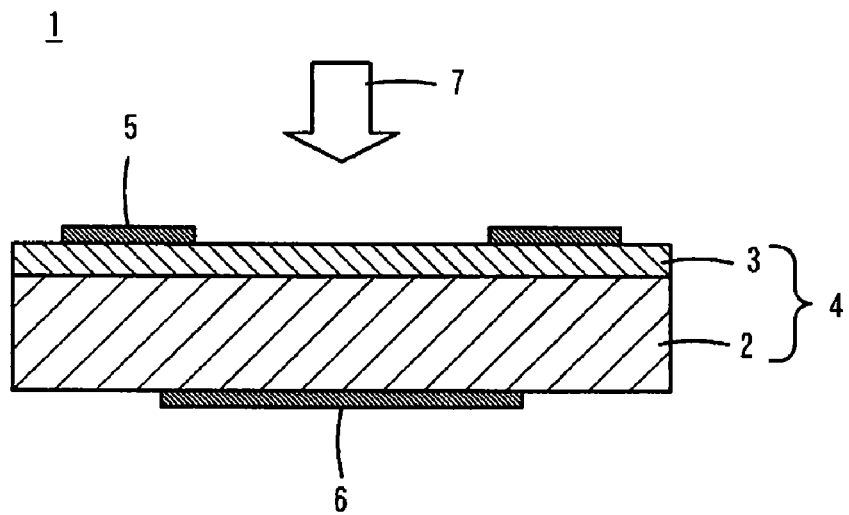
FIG. 1 is a cross-sectional view showing an ultraviolet sensor 1 according to a first embodiment of the present invention.

| Reference Numerals | |
|---|---|
| 1, 1a | ultraviolet sensor |
| 2 | conductive layer |
| 3 | semiconductor layer |
| 4 | layered-structure body |
| 5, 6 | terminal electrode |
| 7 | arrow showing the direction of irradiation of ultraviolet rays |

DETAILED DESCRIPTION OF THE INVENTION

FIG. 1 is a cross-sectional view showing an ultraviolet sensor 1 according to a first embodiment of the present invention.

The ultraviolet sensor 1 has a layered-structure body 4 composed of a conductive layer 2 and a semiconductor layer 3 formed on a principal surface of the conductive layer. On a principal surface and the other principal surface of the layered-structure body 4, terminal electrodes 5 and 6 are provided, respectively.

The conductive layer 2 is made of a sintered ceramic body having conductivity. On the other hand, the semiconductor layer 3 is made of an oxide semiconductor including ZnO and forms a heterojunction with the conductive layer 2. The oxide semiconductor is n-type polycrystal, in contrast to the n-type semiconductor layer described in Patent Document 1, which includes titanium oxide as a main component, and is monocrystal.

The semiconductor layer 3, which is made of the oxide semiconductor including ZnO as mentioned above, may include Al, Co, In, or Ga as a dopant, an Fe-group element such as Fe, Ni, or Mn as a diffusant, and Zr, Si, or the like as an impurity other than ZnO as the main component. In particular, Zr is often included by contamination occurring when a medium is ground.

The semiconductor layer 3 may be a thin film and is preferably a sintered body. If the semiconductor layer 3 is a sintered body, the sintered body serving as a conductive layer 2 and the sintered body serving as a semiconductor layer 3 can be obtained by co-firing. Furthermore, if the co-firing is performed, irregularities are inevitably formed at the interface due to grain growth of each of the sintered bodies. This results in an increase in the effective area of a light-receiving face and an improvement of a light receiving sensitivity. Furthermore, if the semiconductor layer 3 is made of a sintered body, since the ZnO, which is included in the semiconductor layer 3, does not easily diffuse into the conductive layer 2 in a sintering step compared with $TiO_2$ and the like, the interface (barrier) of the conductive layer 2 and the semiconductor layer 3 can be easily formed.

The semiconductor layer 3 preferably includes in particular Co because if Co is included, a dark current is decreased and, as a result, the sensitivity of the ultraviolet sensor can be improved. However, if the content of the Co unpreferably exceeds 3 mol %, the light transmittance is decreased and the sensitivity is lowered due to the decrease of the light transmittance.

The conductive layer 2 preferably includes a transition metal oxide, and the transition metal oxide is preferably a perovskite-type oxide as represented by $ABO_3$ having electrical conductivity (A is an element selected from rare earth elements, Sr, and Ba or a solid solution including at least one element selected from rare earth elements, Sr, and Ba. B is an element selected from Mn, Co, and Ni or a solid solution including at least one element selected from Mn, Co, and Ni). In the case that A is an element selected from rare earth elements, Sr, and Ba and B is an element selected from Mn, Co, and Ni, $ABO_3$ is, for example, $LaMnO_3$, $LaNiO_3$, or $SrMnO_3$. In the case that A is a solid solution including at least one element selected from rare earth elements, Sr, and Ba and B is a solid solution including at least one element selected from Mn, Co, and Ni, $ABO_3$ is, for example, $(La_{0.7}Sr_{0.3})MnO_3$, or $(La_{0.7}Sr_{0.3})(Mn_{0.7}Co_{0.3})O_3$.

Note that the conductive layer 2 is not limited to a layer including a transition metal oxide and that the layer may be composed of any materials as long as the materials have relatively high conductivity and are sinterable. However, the conductive layer 2 may not include any materials forming an ohmic contact to ZnO and may not include any elemental metals. The materials constituting the conductive layer 2 preferably have a low light transmittance and a relatively high mechanical strength.

The ultraviolet sensor 1 is used in such a manner that the semiconductor layer 3 is positioned at a light-receiving side irradiated by the ultraviolet rays whose incident direction is shown with an arrow 7 in FIG. 1. This sensor is characterized in that the principal surface of the semiconductor layer 3 facing outside serves as a light receiving face for the ultraviolet rays. This is a large difference from the sensor described in Patent Document 1. As mentioned above, the sensor described in Patent Document 1 is used in a manner such that a transition metal oxide thin film, which corresponds to the conductive layer 2, is irradiated by the ultraviolet rays.

The terminal electrode 5 is preferably formed in a ring shape so that distances from any points on the above mentioned light-receiving face to the terminal electrode 5 become uniform. Although the terminal electrode 5 of an embodiment shown in FIG. 1 is formed inside the outer periphery of the semiconductor layer 3, the terminal electrode 5 may formed in line with the outer periphery of the semiconductor layer 3. In the latter case, a light-receiving efficiency can be easily improved because the area of light receiving face at the central area of the semiconductor layer 3 can be enlarged and wiring terminals (not shown) and the like can be easily formed without covering the light receiving face.

The ultraviolet sensor 1 is fabricated, for example, as described below.

A green sheet serving as the conductive layer 2 and a green sheet serving as the semiconductor layer 3 are prepared. The green sheet serving as the conductive layer 2 is prepared by adding an organic solvent, dispersant, binder, and flexibilizer to a raw material of inorganic powder including a transition metal oxide, mixing the mixture to form slurry, and molding the slurry into a sheet. The green sheet serving as the semiconductor layer 3 is prepared by adding an organic solvent, dispersant, binder, and flexibilizer to a raw material of inorganic powder including ZnO, mixing the mixture to form slurry, and molding the slurry into a sheet.

The green sheet serving as the conductive layer 2 has a thickness of 50 μm, for example, and ten green sheets are laminated so as to form the conductive layer 2 having a thickness of 0.5 mm. This is an example of the total thickness of the laminated green sheets. However, the total thickness may be arbitrary determined, for example, in a range of 0.1 to 1 mm, and preferably, in a range of 0.2 to 0.6 mm as long as the laminated green sheets have a sufficient strength to serve as a base of a layered-structure body 4 provided for the ultraviolet sensor 1. In consideration of the strength of the material and fabrication of thinner devices, it is suitable that the total thickness is in a range of 0.2 to 0.6 mm. In a case that the green sheets serving as the conductive layer 2 are laminated, the thickness of each of the green sheets and the number of the green sheets to be laminated can be arbitrary changed. Furthermore, one green sheet may serve as the conductive layer 2 without any further green sheets laminated thereon.

The thickness of the green sheet serving as the semiconductor layer 3 is, for example, 20 μm. This thickness may be arbitrary selected from a range of 1 to 50 μm, preferably selected from a range of 5 to 30 μm, and more preferably selected from a range of 5 to 20 μm. Since the green sheet can be formed by a known sheet-molding method such as a doctor blade method, the thickness of the green sheet can be arbitrary selected to achieve the desired thickness. Furthermore, the number of layers of the green sheets can be arbitrary determined. Note that if the thickness of the semiconductor layer 3 becomes undesirably small, electric resistance of the semiconductor layer 3 in the direction of principal surface (in a direction perpendicular to a thickness direction) becomes high and this leads to the sensitivity at the center portion of the light receiving face being low. On the other hand, if the thickness of the semiconductor layer 3 becomes undesirably large, light transmittance is undesirably lowered while the electric resistance is desirably lowered. Therefore, a suitable thickness in an above-mentioned region is desired.

Next, the green sheet serving as the semiconductor layer 3 is laminated and press-bonded onto the green sheet serving as the conductive layer 2, which is prepared as mentioned above. Then, the resulting sheet is cut into bodies having a desired shape, for example, a 10 mm square shape. Note that this cut shape can be further miniaturized to, for example, a 2 to 8 mm square shape according to the desired improvement of the sensitivity. Furthermore, the above-mentioned cut shape, in other words, the shape of the ultraviolet sensor 1 is substantially rectangular when viewed in plan, however, the shape may be another shape such as a circle.

Next, the raw layered-structure body, which is formed by cutting, is sufficiently degreased under a temperature which is gradually increased to 600° C. Then, the layered-structure body is baked at the temperature of 1200 to 1350° C. for 5 hours. In such a manner, the sintered layered-structure body 4 is obtained.

Next, the terminal electrode 5 is formed on the principal surface of the semiconductor layer 3, which constitutes the layered-structure body 4, and the terminal electrode 6 is formed on the principal surface of the conductive layer 2. Examples of the method for forming the terminal electrodes 5 and 6 include sputtering, vapor depositing, printing, applying, and plating. In the case that a printing method is applied, a conductive paste including glass frit may be baked or a conductive adhesive including a curable resin may be cured. The area (width) and thickness of the terminal electrodes 5 and 6 may be arbitrary changed.

In a preferred embodiment, Al is used as a conductive component of the terminal electrode 5 and Au is used as a conductive component of the terminal electrode 6. The conductive components of the terminal electrodes 5 and 6, however, are not limited to those elements. For example, Au may be used for the terminal electrode 5 and Al may be used for the terminal electrode 6. Furthermore, metals such as Ag, Cu, Ni, Pd, and Zn or an alloy including any of those metals may be used.

Note that the terminal electrode 5 formed on the semiconductor layer 3 preferably has Al or Zn as a conductive component in consideration of an ohmic characteristic. The ohmic characteristic, however, is not necessary due to the influence of photovoltaic power generated on the semiconductor layer 3. This is because the terminal electrode 5 acts as a series resistance, so that the terminal electrode does not affect a relative sensitivity value but does an absolute sensitivity value when the semiconductor layer 3 is irradiated.

The ultraviolet sensor 1 can be fabricated as mentioned above.

In the ultraviolet sensor 1, insulation means, which is not shown in drawings, may be provided on the outer surface of the layered-structure body 4 in order to reduce leak current by suppressing a flow of the photocurrent along edges of the conductive layer 2 and the semiconductor layer 3.

Furthermore, protection means may be provided which is made of plastic or the like and protects the layered-structure body 4 without substantially reducing the amount of incident rays traveling into the light-receiving face.

Furthermore, the ultraviolet sensor 1 may be supplied alone as a chip type electronic component or as a module type component in which the ultraviolet sensor is mounted on a circuit substrate and the like.

Examples of applications in which the ultraviolet sensor 1 can be used are as follows; an ultraviolet detector, which is used in an industrial process using ultraviolet rays such as a process using an ultraviolet curable resin or an ultraviolet laser; an ultraviolet detector, which is used in a process for manufacturing a product such as an ultraviolet barrier glass having a function of blocking ultraviolet rays from passing therethrough; a flame sensor; a combustion monitor; a detector for a discharge phenomenon; a detector for leakage of ultraviolet rays; an ultraviolet ray optical switch; an ultraviolet ray optical tester (or a hybrid tester with an electric current tester); an ultraviolet barrier glass; a sun-tanning machine or an apparatus for monitoring sunburn caused in daily living; an optical communication device using ultraviolet light; a toy using ultraviolet rays, and other electronic devices.

Figure 2:
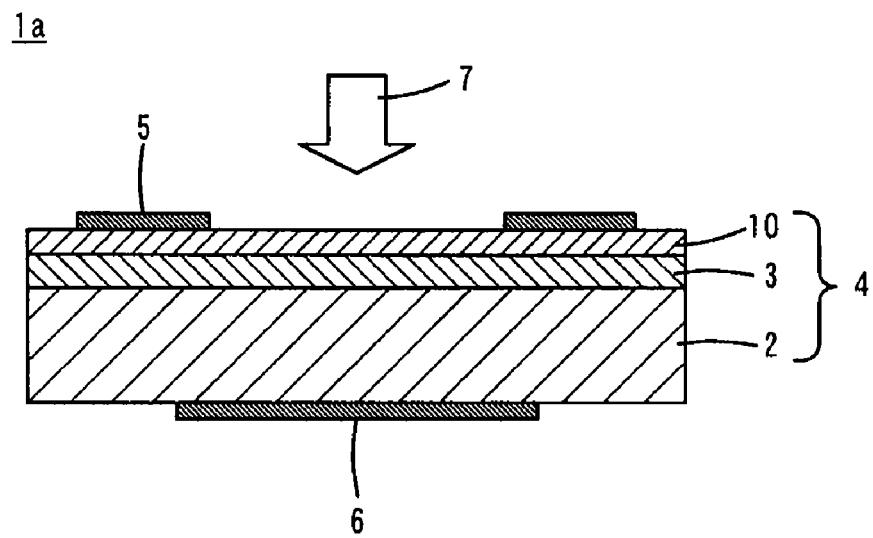
FIG. 2 is a cross-sectional view showing an ultraviolet sensor 1a according to a second embodiment of the present invention.

FIG. 2 is a cross-sectional view showing an ultraviolet sensor 1a according to a second embodiment of the present invention. In FIG. 2, the same reference numerals will be used to denote components corresponding to those shown in FIG. 1, and redundant description is avoided.

The ultraviolet sensor 1a shown in FIG. 2 is characterized in that the layered-structure body 4 further includes a translucent conductive film 10 on the principal surface irradiated by ultraviolet rays at the light-receiving side of the semiconductor layer 3. Therefore, the terminal electrode 5 is provided on the translucent conductive film 10 and the principal surface of the translucent conductive film 10 facing outside serves as a light receiving face for the ultraviolet rays.

The translucent conductive film 10 is made of, for example, Al-doped ZnO, which can reduce electric resistance thereof. The translucent conductive film 10 is formed by sputtering or the like and has a thickness of about 0.5 to 1 μm.

The translucent conductive film 10 reduces resistance in the direction of principal surface (in a direction perpendicular to a thickness direction) of the semiconductor layer 3. Therefore, current loss in the semiconductor layer 3 is reduced and the photocurrent is increased, so that a current sensitivity can be improved.

Next, EXPERIMENTAL EXAMPLES are described. EXPERIMENTAL EXAMPLES were performed to verify the effects provided by the present invention.

1. EXPERIMENTAL EXAMPLE 1

First, in order to form a green sheet serving as a semiconductor layer, raw materials of inorganic powders of ZnO, $Al_2O_3$, and $CO_3O_4$ were weighed according to desired amounts, which were converted into the values of ZnO, $AlO_{3/2}$, and $CoO_{4/3}$, in mol %, respectively, as listed in the column "semiconductor layer" in Table 1. Then, purified water was added to the powders and the resultant was treated by preferential grinding with a ball mill using partially stabilized zirconia (PSZ) beads as a medium. Next, the resulting slurry treated by preferential grinding was dehydrated and dried. Then, the resultant was granulated into bodies having a diameter of about 50 μm and presintered at a temperature of 1200° C. for 2 hours. Next, purified water was added again to the presintered powder obtained in such a manner as mentioned above and the resultant was treated again by preferential grinding with a ball mill using PSZ beads as a medium until the average diameter of the granulated bodies became 0.5 μm. Next, the resulting slurry treated by preferential grinding was dehydrated and dried. Then, an organic solvent and a dispersant were added into and mixed with the resultant, and then, a binder and a flexibilizer were added so as to allow the resulting slurry to be molded. By applying a doctor blade method to the resulting slurry, a green sheet having a thickness of 20 μm and serving as a semiconductor layer was obtained.

On the other hand, in order to form a green sheet serving as a conductive layer, raw material inorganic powders of $La_2O_3$, $SrCO_3$, $BaCO_3$, $Mn_3O_4$, $Co_3O_4$, and NiO were weighed according to desired amounts, which were converted into the values of $LaO_{3/2}$, $SrCO_3$, $BaCO_3$, $MnO_{4/3}$, $CoO_{4/3}$, and NiO, in mol %, respectively, as listed in the column "conductive layer" in Table 1. Then, purified water was added to the powders and the resultant was treated by preferential grinding with a ball mill using PSZ beads as a medium. Next, the resulting slurry treated by preferential grinding was dehydrated and dried. Then, the resultant was granulated into bodies having a diameter of about 50 μm and presintered at a temperature of 1200° C. for 2 hours. Next, purified water was added again to the presintered powder obtained in such a manner as mentioned above and the resultant was treated again by preferential grinding with a ball mill using PSZ beads as a medium until the average diameter of the granulated bodies became 0.5 μm. Next, the resulting slurry treated by preferential grinding was dehydrated and dried. Then, an organic solvent and a dispersant were added into and mixed with the resultant, and then, a binder and a flexibilizer were added so as to allow the resulting slurry to be molded. By applying a doctor blade method to the resulting slurry, a green sheet having a thickness of 50 μm and serving as a conductive layer was obtained.

TABLE 1

| | Semiconductor Layer | | | Conductive Layer | | | | | |
|---|---|---|---|---|---|---|---|---|---|
| Sample No. | ZnO mol % | $AlO_{3/2}$ mol % | $CoO_{4/3}$ mol % | $LaO_{3/2}$ mol % | $SrCO_3$ mol % | $BaCO_3$ mol % | $MnO_{4/3}$ mol % | $CoO_{4/3}$ mol % | NiO mol % |
| 1 | 99.99 | 0.01 | 0 | 45 | 5 | 0 | 50 | 0 | 0 |
| 2 | 99.99 | 0.01 | 0 | 42.5 | 7.5 | 0 | 50 | 0 | 0 |
| 3 | 99.99 | 0.01 | 0 | 40 | 10 | 0 | 50 | 0 | 0 |
| 4 | 99.99 | 0.01 | 0 | 35 | 15 | 0 | 50 | 0 | 0 |
| 5 | 99.99 | 0.01 | 0 | 45 | 0 | 5 | 50 | 0 | 0 |
| 6 | 99.99 | 0.01 | 0 | 42.5 | 0 | 7.5 | 50 | 0 | 0 |
| 7 | 99.99 | 0.01 | 0 | 40 | 0 | 10 | 50 | 0 | 0 |
| 8 | 99.99 | 0.01 | 0 | 35 | 0 | 15 | 50 | 0 | 0 |
| 9 | 99.99 | 0.01 | 0 | 40 | 10 | 0 | 0 | 50 | 0 |
| 10 | 99.99 | 0.01 | 0 | 40 | 10 | 0 | 0 | 0 | 50 |
| 11 | 99.99 | 0.01 | 0 | 40 | 10 | 0 | 30 | 0 | 20 |
| 12 | 99.99 | 0.01 | 0 | 40 | 10 | 0 | 0 | 20 | 30 |
| 13 | 99.99 | 0.01 | 0 | 40 | 10 | 0 | 30 | 20 | 0 |
| 14 | 99.89 | 0.01 | 0.1 | 40 | 10 | 0 | 50 | 0 | 0 |
| 15 | 99.49 | 0.01 | 0.5 | 40 | 10 | 0 | 50 | 0 | 0 |
| 16 | 98.99 | 0.01 | 1 | 40 | 10 | 0 | 50 | 0 | 0 |
| 17 | 98.99 | 0.01 | 1 | 40 | 10 | 0 | 0 | 0 | 50 |
| 18 | 98.99 | 0.01 | 1 | 40 | 10 | 0 | 30 | 20 | 0 |
| 19 | 96.99 | 0.01 | 3 | 40 | 10 | 0 | 50 | 0 | 0 |

Next, in order to obtain the ultraviolet sensor 1 having a structure shown in FIG. 1, 10 green sheets serving as the conductive layer mentioned above were laminated together. Then, a green sheet serving as a semiconductor layer was disposed on the conductive layer and press-bonded using a pressure of 20 MPa. Then, the resulting sheet was cut into bodies each having a 10 mm×10 mm shape.

Next, the raw layered-structure body, which was formed by cutting as mentioned above, was sufficiently degreased under the temperature which was gradually increased to 600° C. Then, the layered-structure body was baked at the temperature of 1250° C. for 5 hours.

Next, an Al film was disposed by vapor deposition on a part of the principal surface of the semiconductor layer constituting the sintered layered structure body so as to form a terminal electrode. Similarly, an Au film was disposed by sputtering on a part of the principal surface of the conductive layer so as to form the other terminal electrode.

Figure 3:
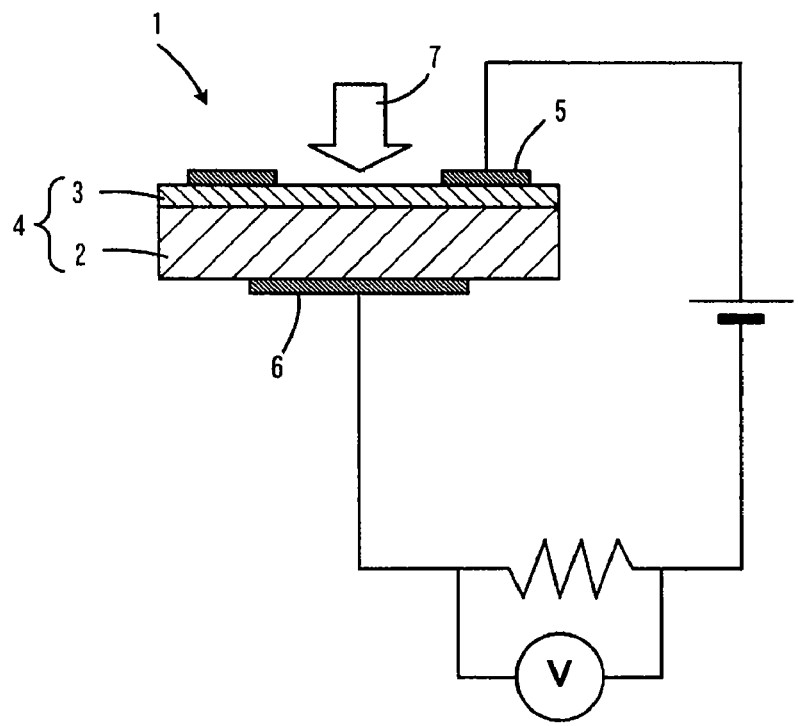
FIG. 3 is a circuit diagram showing an apparatus for measuring photocurrent used in EXPERIMENTAL EXAMPLE.

As shown in FIG. 3, the terminal electrode 5 on the semiconductor layer 3 of a sample of the ultraviolet sensor 1, which was fabricated in above-mentioned manner, served as a positive electrode and the terminal electrode 6 on the conductive layer 2 thereof served as a negative electrode. The outer surface of the semiconductor layer 3 was irradiated in a darkroom by several types of rays, which are represented by an arrow 7, having a particular wavelength listed in Table 2 under a bias voltage of 1 V and photocurrent flowing in the sample of ultraviolet sensor 1 was measured. Note that each of intensities of the above-mentioned rays was 10 mW/cm$^2$ and the temperature was controlled to be 25° C.±1° C. The measurement results of photocurrent are shown in Table 2.

TABLE 2

| Sample No. | 198 nm | 254 nm | 313 nm | 365 nm | 405 nm | 630 nm | Fluorescent Light |
|---|---|---|---|---|---|---|---|
| 1 | 1.06 | 1.86 | 2.05 | 1.85 | 0.06 | 0.00 | 0.01 |
| 2 | 1.21 | 1.88 | 2.10 | 1.86 | 0.03 | 0.00 | 0.02 |
| 3 | 1.04 | 1.93 | 2.35 | 2.14 | 0.04 | 0.00 | 0.03 |
| 4 | 1.18 | 2.15 | 2.54 | 1.95 | 0.04 | 0.00 | 0.01 |
| 5 | 1.06 | 1.56 | 1.96 | 1.45 | 0.07 | 0.00 | 0.01 |
| 6 | 0.95 | 1.05 | 1.85 | 1.00 | 0.03 | 0.00 | 0.01 |
| 7 | 0.85 | 1.00 | 1.43 | 0.82 | 0.03 | 0.00 | 0.03 |
| 8 | 1.21 | 1.53 | 2.16 | 0.93 | 0.04 | 0.00 | 0.01 |
| 9 | 0.75 | 1.46 | 2.41 | 1.33 | 0.09 | 0.00 | 0.01 |
| 10 | 0.83 | 1.72 | 2.55 | 1.70 | 0.08 | 0.00 | 0.01 |
| 11 | 0.92 | 1.62 | 2.24 | 1.39 | 0.06 | 0.00 | 0.02 |
| 12 | 0.85 | 1.54 | 1.85 | 1.54 | 0.05 | 0.00 | 0.03 |
| 13 | 0.97 | 1.19 | 1.65 | 0.93 | 0.07 | 0.00 | 0.02 |
| 14 | 1.05 | 1.95 | 2.30 | 2.11 | 0.03 | 0.00 | 0.03 |
| 15 | 1.90 | 3.28 | 3.45 | 2.00 | 0.15 | 0.00 | 0.03 |
| 16 | 1.85 | 3.12 | 3.45 | 1.87 | 0.12 | 0.00 | 0.05 |
| 17 | 1.74 | 2.55 | 2.84 | 1.66 | 0.09 | 0.00 | 0.04 |
| 18 | 1.01 | 0.95 | 1.86 | 0.95 | 0.06 | 0.00 | 0.05 |
| 19 | 0.08 | 0.52 | 0.63 | 0.31 | 0.00 | 0.00 | 0.00 |

(unit: mA)

As shown in Table 2, in all samples, responses generated by the light of 405 nm or the fluorescent light were small and no responses were generated by the light of 630 nm. According to the results, it was found that the light of 405 nm or the fluorescent light included a small amount of ultraviolet rays and, in all samples, the responses were generated only by the included ultraviolet rays. The maximum response current was generated by the incident light of 313 nm and the maximum output was 3.45 mA. Therefore, if the shape or the like of the terminal electrode is optimized, the sensitivity will be further improved.

As mentioned above, the response sensitivity of the samples fabricated in EXPERIMENTAL EXAMPLE 1 to ultraviolet rays was improved because band gaps of ZnO and ABO$_3$ perovskite-type oxide are large and carriers were generated in a depletion layer at a junction therebetween and the photocurrent was detected. The possible cause of the increase in the detected current is that the effective area, which was an area of the interface of the junction between the conductive layer made of a sintered ceramic body and the semiconductor layer, was large and the conductive layer did not transmit light, so that an absorption index of ultraviolet rays was increased. Also, the low resistivity of the conductive layer, which was as low as $10^{-3}$ Ω·cm and lower than that of TiO$_2$ and the like, allowed a large current to flow so as to contribute the increase in the current.

The semiconductor layers of Samples 14 to 19 include 0.1 to 3 mol % Co. Therefore, the increase in the sensitivity of the samples can be verified by comparison with Samples 1 to 13 that do not include Co.

2. EXPERIMENTAL EXAMPLE 2

By using a sample similar to Sample 14 fabricated in EXPERIMENTAL EXAMPLE 1, the existence or non-existence of a translucent conductive film was examined. That is, a sample the same as Sample 14 fabricated in EXPERIMENTAL EXAMPLE 1 was defined as a sample "without a translucent conductive film." In contrast to this, another sample was fabricated and defined as a sample "with a translucent conductive film," which was similar to Sample 14 other than that a thin film of Al-doped ZnO having a thickness of 1 μm, which resistance was decreased by doping with Al, was formed by a sputtering method as a translucent conductive film on the outer surface of the semiconductor layer constituting the sintered layered-structure body.

Next, the photocurrent in the samples was measured by the same method as used in EXPERIMENTAL EXAMPLE 1 under various intensities of irradiation using a light source having a wavelength of 313 nm. The results are shown in FIG. 4.

Figure 4:
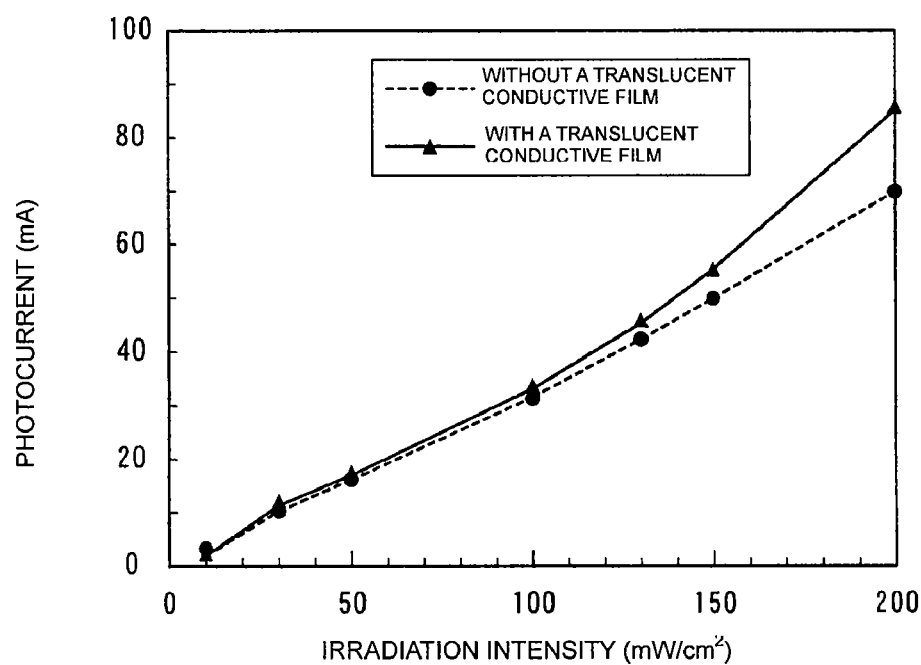
FIG. 4 is a graph showing results of the photocurrent measured under various intensities of irradiation. Samples "without a translucent conductive film" and samples "with a translucent conductive film", which are fabricated in EXPERIMENTAL EXAMPLE 2, were irradiated by the rays.

According to FIG. 4, the photocurrent in the sample of "with a translucent conductive film" is large compared with that of the sample of "without a translucent conductive film," and the current sensitivity is improved.

The invention claimed is:

1. An ultraviolet sensor including a layered-structure body, comprising:
a conductive layer composed of a sintered ceramic body having conductivity;
a semiconductor layer composed of an oxide semiconductor including ZnO, disposed on a principal surface of the conductive layer such that a photocurrent is generated at a junction
between the conductive layer and the semiconductor layer; and
a terminal electrode provided on a principal surface of the layered-structure body and a terminal electrode provided on the other principal surface thereof,
wherein the semiconductor layer is positioned at a light-receiving side irradiated by ultraviolet rays,
the semiconductor layer is composed of a sintered body, and
the sintered ceramic body serving as the conductive layer and the sintered body serving
as the semiconductor layer are co-fired layers.

2. The ultraviolet sensor according to claim 1, wherein the semiconductor layer includes 0.1 to 3 mol % Co.

3. The ultraviolet sensor according to claim 1, wherein the conductive layer includes a transition metal oxide.

4. The ultraviolet sensor according to claim 3, wherein the transition metal oxide is a perovskite-type oxide represented by $ABO_3$, wherein A is an element selected from rare earth elements, Sr, and Ba or a solid solution including at least one element selected from rare earth elements, Sr, and Ba, and B is an element selected from Mn, Co, and Ni or a solid solution including at least one element selected from Mn, Co, and Ni.

5. The ultraviolet sensor according to claim 1, further comprising a translucent conductive film provided on a principal surface of the semiconductor layer at a light-receiving side irradiated by ultraviolet rays.

* * * * *